(12) United States Patent
Pauls (10) Patent No.: US 6,285,219 B1
(45) Date of Patent: Sep. 4, 2001

(54) DUAL MODE PHASE AND FREQUENCY DETECTOR

(75) Inventor: Gregory W. Pauls, Lafayette, CA (US)

(73) Assignee: Adaptec, Inc., Milpitas, CA (US)

( * ) Notice: Subject to any disclaimer, the term of this patent is extended or adjusted under 35 U.S.C. 154(b) by 0 days.

(21) Appl. No.: 09/539,480

(22) Filed: Mar. 30, 2000

(51) Int. Cl.$^7$ .............................. H03D 13/00; H03L 7/06
(52) U.S. Cl. .............................. 327/3; 327/12; 327/157; 327/148; 331/14
(58) Field of Search .................................... 327/141, 147, 327/148, 150, 156, 157, 158, 159, 2, 3; 331/11, 14

(56) References Cited

U.S. PATENT DOCUMENTS

| | | | |
|---|---|---|---|
| 5,467,331 | * 11/1995 | Saiki et al. ............................... | 369/53 |
| 5,610,560 | * 3/1997 | Sauer et al. .............................. | 331/11 |
| 5,663,675 | 9/1997 | O'Shaughnessy .................... | 327/553 |

OTHER PUBLICATIONS

Young et al., "A PLL Clock Generator with 5 to 110 MHz of Lock range for Microprocessors", pp. 1599–1607, IEEE Journal of Solid–State Circuits, vol. 27, No. 11, Nov. 1992.

Lee et al., "a 155–MHz Clock Recovery Delay–and Phase–Locked Loop", pp.1736–1746, IEEE Journal of Solid–State Circuits, vol. 27, No. 12, Dec. 1992.

Novof et al., "Fully Integrated CMOS Phase–Locked Loop with 15 to 240 MHz Locking Range and ±50 ps Jitter", pp. 1259–1266, IEEE Journal of Solid–State Circuits, vol. 39, No. 11, Nov. 1995.

Kim et al., "A 960–Mb/s/pin Interface for Skew–Tolerant Bus Using Low Jitter PLL", pp.691–700, IEEE Journal of Solid–State Circuits, vol. 32, No. 5, May 1997.

Rau et al, "Clock/Data Recovery PLL Using Half–Frequency Clock", pp.1156–1159, IEEE Journal of Solid–State Circuits, vol. 32, No. 7, Jul. 1997.

Johns et al., "Analog Integrated Circuit Design", Chapter 13, pp. 492–494, ©1997, John Wiley & Sons, Inc., Canada.

Huelsman et al., "Introduction to the Theory and Design of Active Filters", pp. 157–162, ©1980, McGraw–Hill, Inc.

(List continued on next page.)

Primary Examiner—Dinh T. Le
(74) Attorney, Agent, or Firm—Martine & Penilla, LLP (57) ABSTRACT

The present invention provides a dual mode phase and frequency detector for use with a charge pump and a loop filter. The charge pump is adapted to adjust charging or discharging of the loop filter to adjust a VCO for generating a digital clock. The dual mode phase and frequency detector includes a phase and frequency detector and a first delay element. The phase and frequency detector is arranged to receive the VCO clock for tracking a reference clock signal. The phase and frequency detector generates control signals in response to the VCO clock and the reference clock signal. The control signals control charging or discharging of a loop filter in a DLL when the phase and frequency detector is operating in a phase and frequency detector mode. The first delay element is coupled to receive one of the control signals from the phase and frequency detector for generating an auxiliary control signal in response to the VCO clock. The first delay element generates the auxiliary control signal when the phase and frequency detector is operating in a phase detector mode. In this arrangement, the auxiliary control signal and the control signals control the charge pumps to charge or discharge the loop filter for adjusting the digital clock of the VCO when the phase and frequency detector is operating in the phase detector mode.

24 Claims, 6 Drawing Sheets

OTHER PUBLICATIONS

Durham et al., "Low Distortion VLSI Compatible Self-Tuned Continuous–Time Monolithic Filters", pp.333–336, IEEE ISCAS, Section 5–A, Active RC Filters.

Durham et al., "Circuit Architecture for High Linearity Monlithic Continuous–Time Filtering", pp.651–657, IEEE, Analog and Digital Signal Processing, Sep. 1992, vol. 39, No. 9, New York. NY.

Durham et al., "Integrated Continuous–Time Balanced Filtered for 16–b DSP Interfaces", pp. 835–839, IEEE Journal of Solid–State Circuits, vol. 28, No. 7, Jul. 1993.

Grebene, "Bipolar and MOS Analog Integrated Circuit Design", pp. 825–879, ©1984, John Wiley & Sons, Inc., Canada.

* cited by examiner

DUAL MODE PHASE AND FREQUENCY DETECTOR

BACKGROUND OF THE INVENTION

1. Field of the Invention

This invention relates generally to the field of data synchronizers. More particularly, the present invention relates to phase and frequency detectors in data synchronizers that can function as phase detectors without the need for a delay lock loop (DLL).

2. Description of the Related Art

Data communication and synchronization applications typically use a clock signal to synchronize and regulate the processing of data signal. For data processing, for example, the clock signals typically extracted from an incoming digital (e.g., binary) data signal in a digital signal format such as non-return-to-zero (NRZ) format. These applications generally use a phase-locked loop (PLL), often called data synchronizer or frequency synthesizer, to synchronize a clock signal with a digital data signal.

In data transmission, user data is often preceded by a preamble such as a sync field that contains a regular pattern of digital data. In data synchronizers, a phase and frequency detector may be used to lock the phase and frequency of the clock signal to that of the sync data whenever a sync field is encountered. In this manner, the clock in the data synchronizer is kept synchronized to the phase and frequency of the sync data.

After locking phase and frequency of the clock to the sync data, the data synthesizer receives data in the data field. In contrast to the data, the data in the data field is a random pattern of 0's and 1's. When such random data pattern is encountered, the data synchronizer needs to maintain a phase lock to the data while detecting the data. For such purposes, the data synchronizer uses a phase detector to maintain the phase lock.

Conventional data synchronizers have two main modes of operation: data/clock recovery and idle. During an idle mode, a data synchronizer locks to both the frequency and phase of a reference clock. On the other hand, during data recovery, the data synchronizer locks to only the phase of the incoming data since the frequency of the data changes depending on the data pattern. For example, a data pattern "001100110011" has a frequency twice that of a data pattern "000011110000." However, because the data rate is the same for both patterns, the data synchronizer must recover the same clock for both patterns.

Traditionally, a delay lock loop (DLL), which is well known in the art, is used in conjunction with a phase and frequency detector to perform the two modes of operation. When used alone, the phase and frequency detector will perform both phase and frequency detection at the same time. The DLL is used to produce a data stream that is exactly 50% delayed. The non-delayed data is used to enable the phase and frequency detector. The delayed data is sent to the phase and frequency detector as data. Hence, the phase and frequency detector is enabled only for error correction when the data makes a transition from a "0" to "1". In this manner, the DLL allows the phase and frequency detector to make only phase corrections and not frequency corrections.

Figure 1:
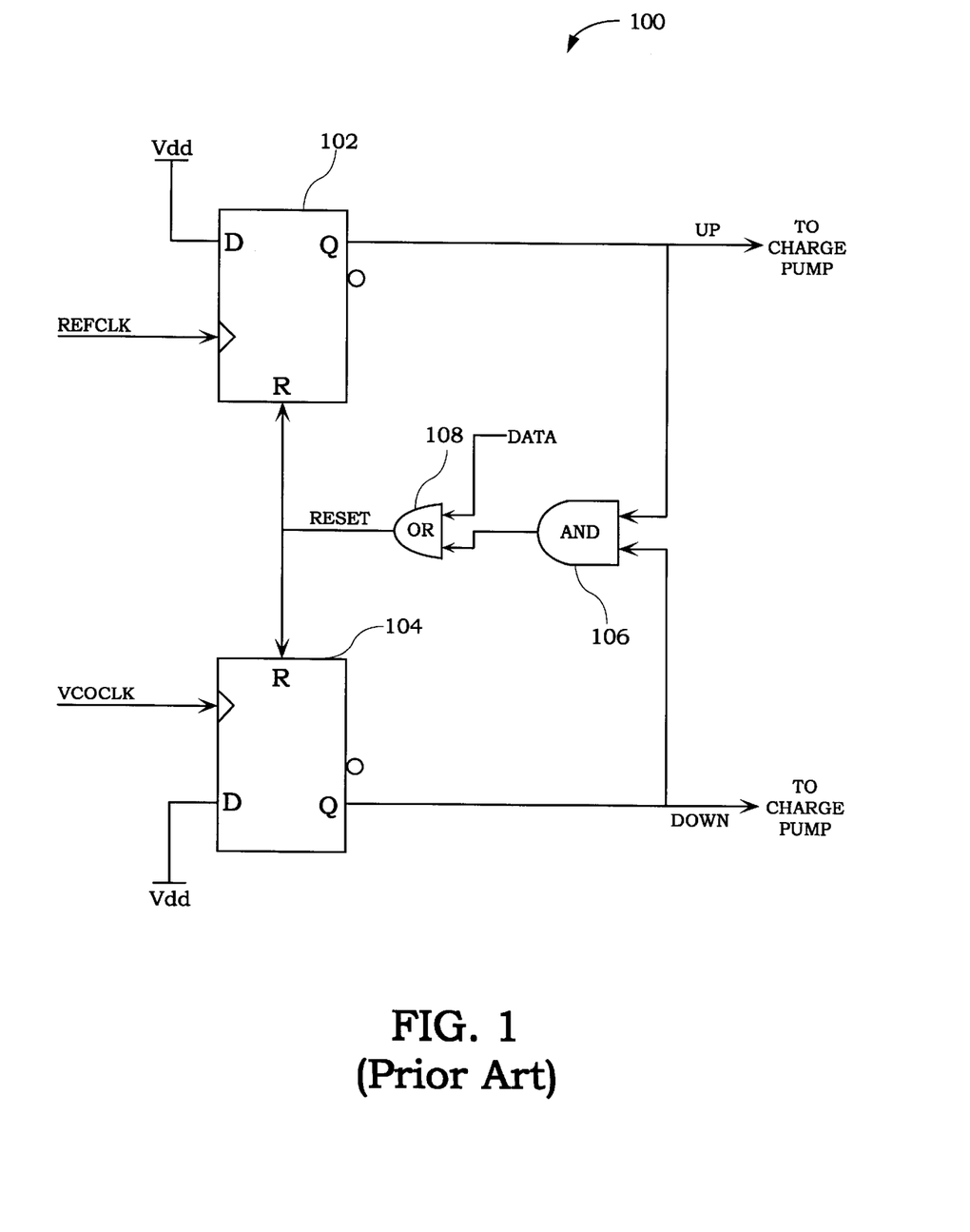
FIG. 1 shows a schematic circuit diagram of a conventional phase and frequency detector for use in a data synchronizer.

FIG. 1 shows a schematic circuit diagram of a conventional phase and frequency detector 100 used with a data synchronizer. The phase and frequency detector 100 includes a pair of D flip-flops 102 and 104, an AND gate 106, and an OR gate 108. The D flip-flops 102 and 104 are configured to receive a reference clock REFCLK which is the 50% delayed DATA and a voltage controlled oscillator (VCO) clock VCOCLK from a VCO (not shown), respectively. In addition, the "D" input ports of the flip-flops 102 and 104 are coupled to a high voltage rail vdd. The D flip-flops 102 and 104 generate output signals UP and DOWN, respectively. The UP and DOWN signals are correction signals that are provided to a charge pump (not shown) to speed up and slow down, respectively, the VCO that generates the VCOCLK.

As is well known in the art, each of the D flip-flops 102 and 104 outputs the states that is present on the "D" input as UP or DOWN signal whenever the clock signal goes high at the other input port (i.e., REFCLK and VCOCLK). The AND gate 106 is coupled to receive the outputs of the D flip-flops 102 and 104 as inputs and generates an output signal, which is provided to the OR gate 108 as an input. The OR gate 108 also configured to receive DATA during the phase only mode only. During phase and frequency lock mode, i.e., sync field, DATA is set to "1." In response to the input signals, the OR gate 108 generates a reset signal RESET that is used to reset the flip-flops 102 and 104. By either speeding up or slowing down the VCO via the charge pump using the UP and DOWN signals, the phase and frequency detector 100 locks the phase and frequency of the VCOCLK to those of the reference clock REFCLK.

Figure 2:
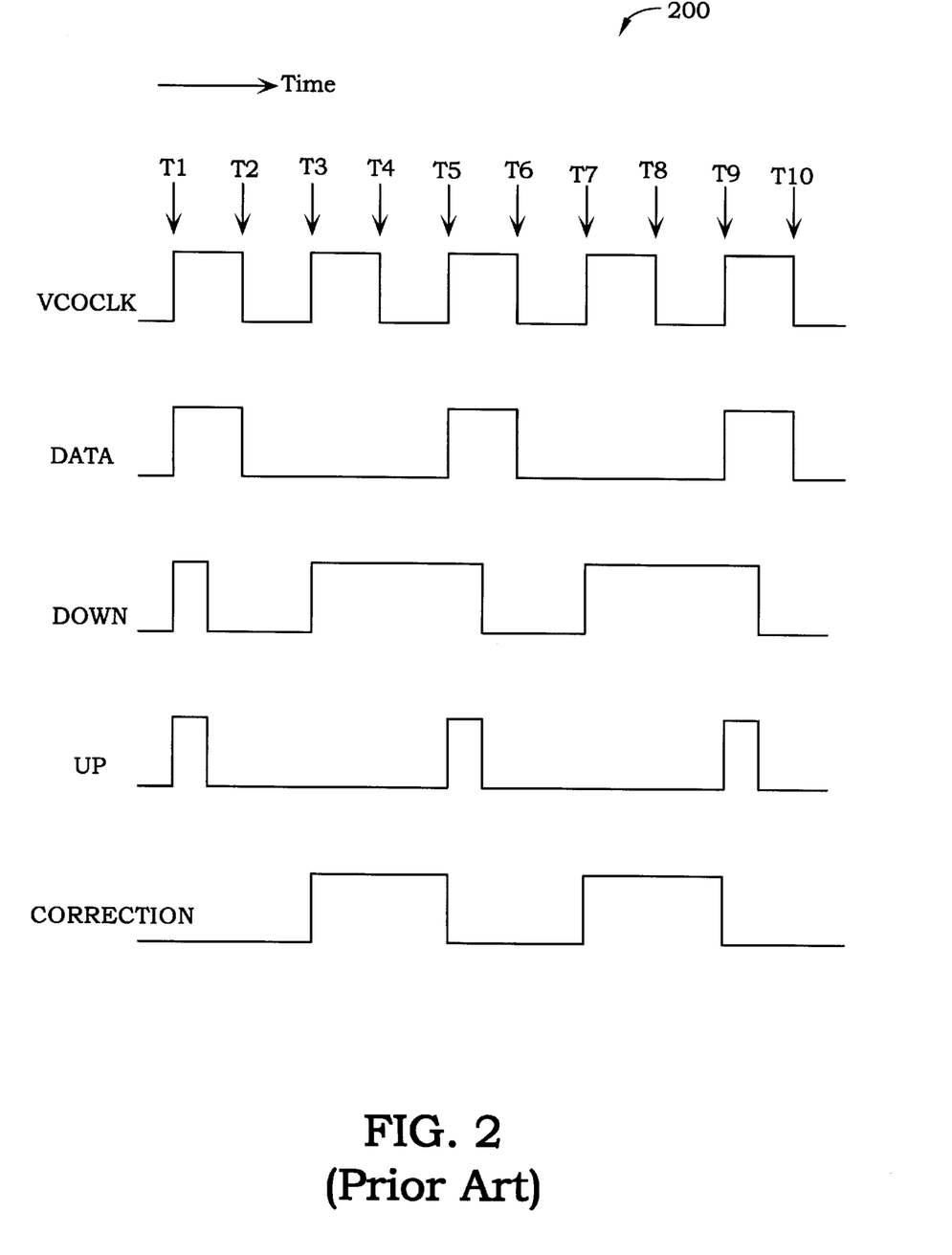
FIG. 2 illustrates a timing diagram of the phase and frequency detector in FIG. 1 when synchronizing REFCLK to DATA preamble.

When the phase and frequency detector 100 is used to detect data, the D flip-flop 102 receives incoming data signal as REFCLK. FIG. 2 illustrates a timing diagram 200 of the phase and freguency detector 100 when synchronizing REF-CLK to DATA preamble signal. At the rising edge of the reference clock signal REFCLK at time T3, the signal DOWN is activated while UP signal remains inactive. Then, for a full cycle from time T3 time T5, the DOWN signal is provided to the charge pump to slow down the VCO because the REKCLK is deemed to be faster than the data. At the rising edge of next REFCLK pulse (i.e., time T5), the phase and frequency detector 100 detects the transition of data signal to high. The signals UP and DOWN are both high at this point so that no correction is needed. In response to the simultaneous activation of UP and DOWN signals, the AND gate 106 generates a RESET signal, which is provided for resetting the flip-flops 102 and 104. As used herein, the DOWN and UP signals are correction signals and the net result of DOWN and UP signals is shown in FIG. 2 as waveform CORRECTION.

As can be seen from the timing diagram 200, however, the phase and frequency detector 100 over corrects by a full clock cycle when a data pattern of two clocks periods is received. For example, from T3 to T5 and again from T7 to T9, the phase and frequency detector 100 overcorrects as indicated by the CORRECTION signal. This is because the signal DOWN should not have been activated at the second rising edge of REFCLK signal (i.e., time T3) because the REFCLK phase is aligned properly in phase. On the following REFCLK cycle (i.e., at time T5), the phase and frequency detector then activities the UP signal which resets the phase and frequency detector 100. This same error occurs again at time T7.

The source of such over correction is that the phase and frequency detector 100 is comparing the incoming data's phase and frequency against the data synchronizer clock, which is typically a stream of pattern such as "010101010101." If the data pattern were in a form such as "001100110011," the phase and frequency detector would try to slow the data synchronizer clock down to match the frequency of the data. In practice, however, the data synchronizer clock typically need to be at higher frequency. Otherwise, the data will be recovered at the improper data rate. Clearly, the phase and frequency detector 100 will not recover data correctly without a gating signal. A DLL will provide the 50% delay DATA as a gating pulse.

The drawback of using the phase and frequency detector 100 to synchronize only phase of the VCOCLK to the data signal REFCLK is cost. In particular, using the phase and frequency detector 100 to track the phase of the data signal requires costly analog hardware such as a delay lock loop (DLL) with its own charge pump, loop filter, and a phase and frequency detector. Furthermore, such hardware arrangement typically requires substantially higher power that a complete digital solution for proper operation.

Thus, what is needed is a phase and frequency detector that can also be used for efficiently tracking phase of data signals without the high costs involved in conventional phase and frequency detectors.

SUMMARY OF THE INVENTION

Broadly speaking, the present invention fills these needs by providing a dual mode phase and frequency detector for a data synchronizer. It should be appreciated that the present invention can be implemented in numerous ways, including as a process, an apparatus, a system, computer readable media, or a device. Several inventive embodiments of the present invention are described below.

In one embodiment, the present invention provides a dual mode phase and frequency detector for use with charge pump and a loop filter. The charge pump is adapted to adjust charging or discharging of the loop filter to adjust VCO for generating a digital clock. The dual mode phase and frequency detector includes a phase and frequency detector and a first delay element. The phase and frequency detector is arranged to receive the VCO clock for tracking a reference clock signal. The phase and frequency detector generators control signals in response to the VCO clock and the reference clock signal. The control signals control charging or discharging of a loop filter in a DLL when the phase and frequency detector is operating in a phase and frequency detector mode. The first delay element is coupled to receive one of the control signals from the phase and frequency detector for generating an auxiliary control signal in response to the VCO clock. The first delay element generates the auxiliary control signal when the phase and frequency detector is operating in a phase detector mode. In this arrangement, the auxiliary control signal and the control signals control the charge pump to charge or discharge the loop filter for adjusting the digital clock of the VCO when the phase and frequency detector is operating in the phase detector mode.

In another embodiment, the present invention provides a dual mode phase and frequency detector for use with a charge pump and a loop filter, which is adapted to adjust a VCO for generating a VCO clock. The dual mode phase and frequency detector includes a phase and frequency detector and a first delay element. The phase and frequency detector is arranged to receive the VCO clock for tracking a reference clock signal. The phase and frequency detector generates a first control signal and a second control signal in response to the VCO clock and the reference clock signal. The first and second control signals control the charge pump for charging or discharging the loop filter when the phase and frequency detector is operating in a phase and frequency detector mode. The first delay element is coupled to receive the second control signal from the phase and frequency detector for generating an auxiliary control signal in response to the VCO clock. The first delay element generates the auxiliary control signal when the phase and frequency detector is operating in a phase detector mode. In this configuration, the auxiliary control signal and the first and second control signals control the charge pump that adjusts the charging or discharging of the loop filter for controlling the VCO clock when the phase and frequency detector is operating in the phase detector mode such that the VCO clock tracks only the phase of the reference clock signal.

In yet another embodiment, a data synchronizer is disclosed. The data synchronizer includes a charge pump, a loop filter, a VCO, a phase and frequency detector, and a first delay element. The charge pump is configured to generate an output signal for adjusting charging or discharging of the loop filter that generates a VCO control signal. The VCO is coupled to receive the VCO control signal from the loop filter where the VCO control signal is adapted to adjust the VCO for generating a VCO clock. The phase and frequency detector is coupled to receive the VCO clock for tracking a reference signal that has a phase and a frequency. The phase and frequency detector generates first control signals in response to the VCO clock and the reference signal. The control signals are adapted to control adjust the charge pump for tracking the phase and frequency of the reference signal. The first delay element is coupled to the phase and frequency detector for generating a second control signal. The first delay element generates the second control signal in response to one of the first control signals for tracking only the phase of the reference signal. In this arrangement, the first control signals and the second control signal are adapted to adjust the charge pump for tracking only the phase of the reference signal.

Advantages the use of the delay element (e.g., flip-flop, latch with reset capability) in conjunction with a phase and frequency detector provides significant savings in the cost, power, and die area over conventional solutions that typically uses expensive data locked loops with additional circuits such as a charge pump, filter, divider, etc. In addition, the present invention allows efficient correction for the worst case of half cycle delay with minimal data detection window closing that causes racing conditions and allows proper corrections to be made for less severe pulse sliding situations as well. Other aspects and advantages of the invention will become apparent from the following detailed description, taken in conjunction with the accompanying drawings, illustration by way of example the principles of the invention.

BRIEF DESCRIPTION OF THE DRAWINGS

The present invention will be readily understood by the following detailed description in conjunction with the accompanying drawings, in which like reference numerals designated like structural elements.

DETAILED DESCRIPTION OF THE PREFERRED EMBODIMENTS

The present invention provides a dual mold phase and frequency detector that can function as either phase and frequency detector or phase-only detector. It will be obvious, however, to one skilled in the art, that the present invention may be practiced without some or all of these specific details. In other instances, well known process operations have not been described in detail in order not to unnecessarily obscure the present invention.

Figure 3:
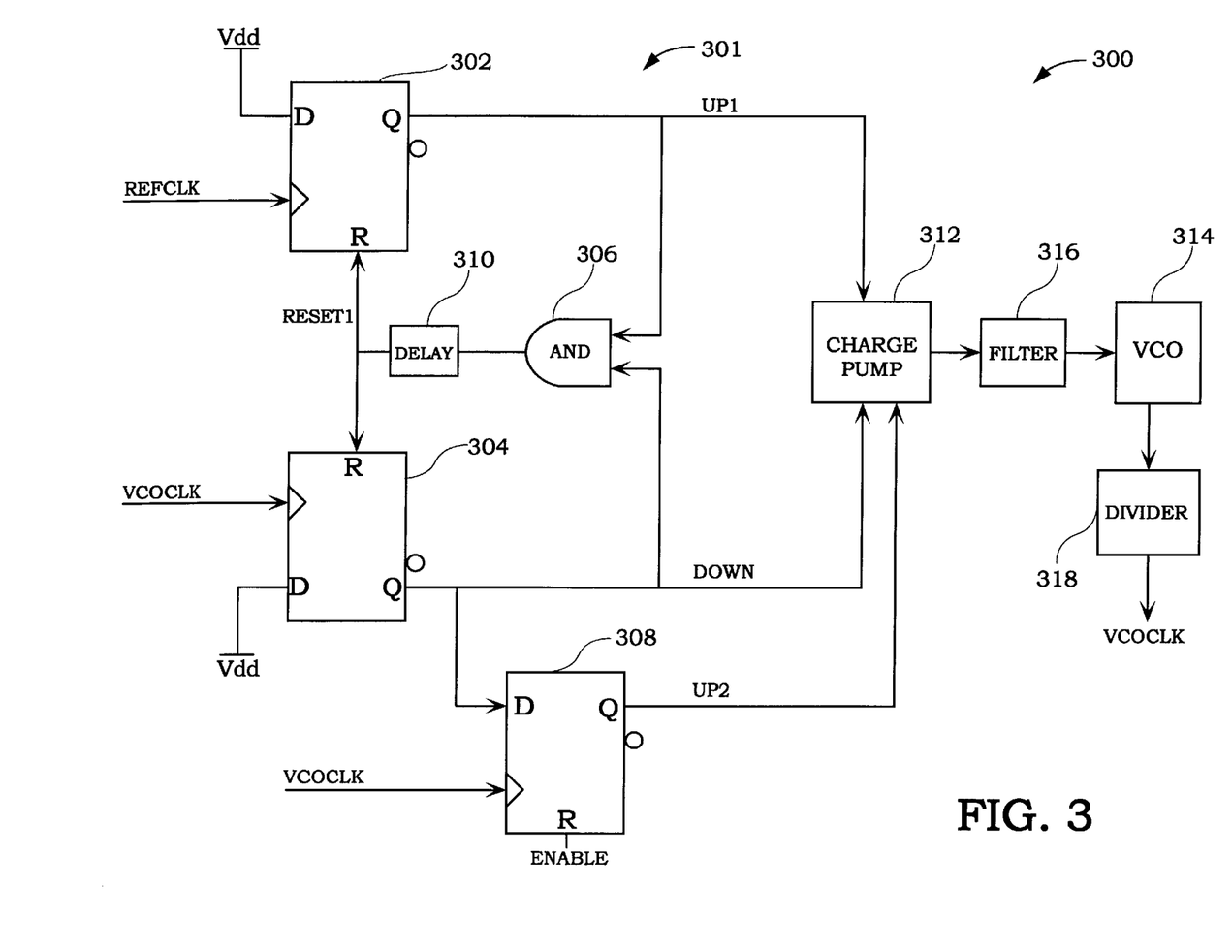
FIG. 3 shows a dual mode phase and frequency detector in accordance with one embodiment of the present invention.

FIG. 3 shows a data synchronizer 300 including a dual mode phase and frequency detector 301 in accordance with one embodiment of the present invention. The data synchronizer 300 also includes a charge pump 312, a loop filter 316, a VCO 314, and an optional driver 318. As will be discussed in more detail below, the dual mode phase and frequency detector 301 provides correction signals to the charge pump 312. In response, the charge pump 312 generates a signal, a current in this embodiment, for controlling the VCO 314. The filter 316, which is preferably a low pass filter, receives and converts the current into a voltage, which is provided to the VCO 314. In response to the voltage signal, the VCO 314 adjusts the speed of its output clock. The output clock is then fed into the driver, which divides the output clock by a specified factor to generate an adjusted VCOCLK. The VCOCLK is then provided as an input to the dual mode phase and frequency detector 301. The entire loop reacts until the VCOCLK matches the phase and frequency of REFCLK.

The dual mode phase and frequency detector 301 includes flip-flops 302, 304, and 308, an AND gate 306, and a delay circuit 310. The flip-flops 302 and 304 receive a reference clock REFCLK and VCOCLK from the divider 318, respectively, as inputs. The REFCLK is data when the detector 301 operates in a phase detection mode. On the other hand, the REFCLK is a preamble of the data when operating in a phase and frequency detection mode.

In addition, one of the input ports (e.g., D input ports) of each flip-flop 302 and 304 is coupled to a supply voltage rail vdd. In the illustrated embodiment, the flip-flops 302, 304, and 308 are D flip-flops that outputs the state of the D input ports whenever the other input signal at the clock port transitions from low to high state. However, the flip-flops 302, 304, and 308 may also be implemented by using any well known delay elements (e.g., latches, flip-flops, etc.) that can be set and reset. In an another embodiment, the AND gate may be implemented using any suitable logic elements such as a NAND gate to provide the equivalent function.

Each of the flip-flops 302, 304, and 308 outputs the state of the D input ports as output signals UP1, DOWN, and UP2, respectively, when the input clock signal at the respective flip-flops 302, 304, and 308 transitions from low to high. The output signals UP1, DOWN, and UP2 of the flip-flops 302, 304, and 308 are provided to a charge pump 312 for controlling the charge pump 312, respectively, to adjust charging or discharging of the loop filter 316. For example, the UP1 and UP2 signals enable the charge pump 312 to charge up the loop filter 316 while the DOWN signal allows the charge pump 312 to charge down the loop filter 316. In response to the UP1, DOWN, and UP2 signals, the charge pump 312 generates current signal that is provided to the loop filter 316, which converts the current into a voltage signal. The charging of the loop filter 316 is a function of the net sum of the three signals UP1, UP2, and DOWN. That is, the net sum is the difference between the total charge up signals UP1 and UP2 and the DOWN signal, which is described as DOWN waveform XORed with UP1 and UP2 waveform. These signals adjust the charge pump 312 to charge up, down, or remain neutral depending on the net sum of the signals UP1, UP2, and DOWN.

The charge pump 312 outputs the current that is used, via loop filter 316, to slow down or speed up the VCO 314, which generates the VCOCLOK for tracking the input signal REFCLK at the flip-flop 302. By controlling the charging of the charge pump 312 and thus the VCO, the phase and frequency detector 301 tracks the phase of the VCOCLK to that of the REFCLK. The AND gate 306 is coupled to receive the outputs of the flip-flops 302 and 304 as inputs. In response to the inputs, the AND gate 306 generates a reset signal as an output that is fed to the delay circuit 310. The delay circuit 310, which is optional, adds a delay to the reset signal. The delayed reset signal is then provided for resetting the flip-flops 302 and 304.

The flip-flop 308 is coupled to receive the VCOCLK at its input clock port from the divider 318 and the DOWN signal at its D input port from the flip-flop 304. When the signal at the input clock port changes state from low to high, the flip-flop 308 outputs the state of the DOWN signal at its "D" input port as UP2 signal. The flip-flop 308 can be either enable or disable in response to an enable signal ENABLE (e.g., reset signal). For example, when ENABLE signal is inactive, the flip-flop 308 is disabled so that the flip-flop 308 does not generate the UP2 signal. In this case, the dual mode phase and frequency detector 301 functions in phase and frequency detector mode. During this mode, the flip-flop 302 receives a regular pattern for signal REFCLK such as preamble of data.

On the other hand, when the ENABLE signal is active, the flip-flop 308 is activated to generate the UP2 signal. In this case, the dual mode phase and frequency detector 301 functions as a phase-only detector. Thus, the dual mode phase and frequency detector 301 may function as either a phase and frequency detector or a phase detector.

Figure 4:
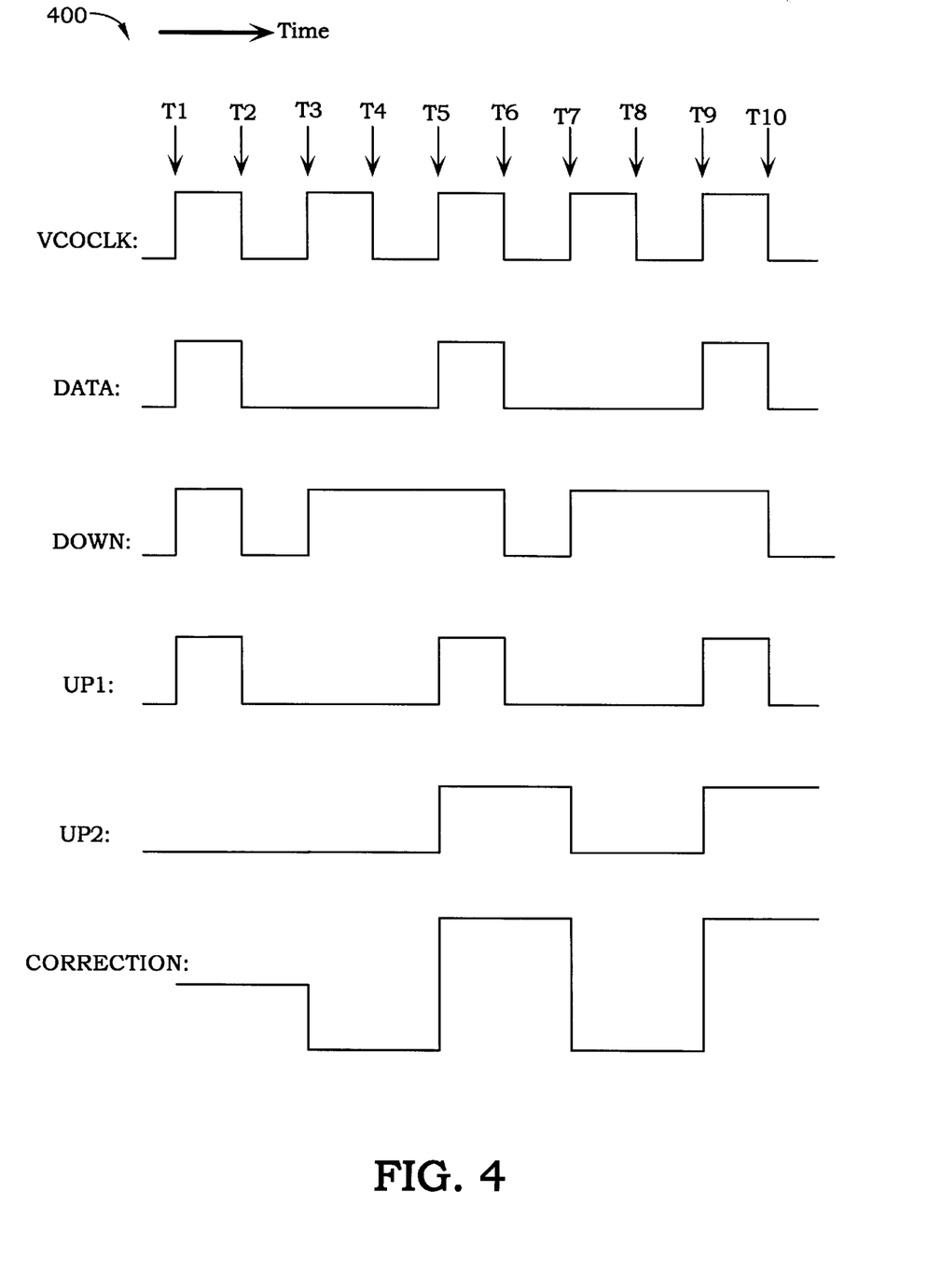
FIG. 4 illustrates a timing diagram of the dual mode phase and frequency detector when operating as a phase detector in accordance with one embodiment of the present invention.

FIG. 4 illustrates a timing diagram 400 of the dual mode phase and frequency detector 301 when operating as phase detector in accordance with one embodiment of the present invention. When operating in the phase-only detection mode, the flip-flop is enable by ENABLE signal. In addition, the flip-flops 304 and 308 receive VCOCLK at the input clock ports while the flip-flop 302 receives data for REF-CLLK as DATA signal. At the rising edge of CLK (i.e., VCOCLK) at time T1, both DATA and VCOCLK signals transition from low to high. Hence, both UP1 and DOWN signals transition from low to high at the outputs of flip-flop 302 and 304, respectively. However, the UP2 signal remains low at the output of the flip-flop 308 because the DOWN signal at the input of flip-flop 308 is still low during this transition time. In response to the high UP1 and DOWN signals, the AND gate activates RESET1. Then, the flip-flops 302 and 304 are reset in response to RESET1 so that both UP1 and DOWN signals transition to low at time T2. Additionally, because the UP1 and DOWN signals cancel each other out, the charge pump 312 does not change the charging state. Hence, no correction on VCOCLK takes place between T1 and T3.

Then, at the next rising edge of VCOCLK at T3, DOWN signal at the ouput of flip-flop 304 is activated (i.e., high). In the meantime, UP1 signal remains inactive (i.e., low) at the output of flip-flop 302 because DATA is low at T3. Additionally, the UP2 signal remains low at the output of the flip-flop 308 because the DOWN signal at the input of flip-flop 308 is still low during the transition time. In response to the low UP1 and high DOWN states, the AND gates generates RESET1 signal, which is low. According, the flip-flops 302 and 304 are not reset. Then, for a full clock cycle from time T3 to time T5, the activated DOWN signal is provided to the charge pump 312 as correction signal to slow down the VCO 314, which is incorrect since the phase is aligned. This is because the correction signal CORRECTION corresponds to the net sum of the DOWN signal, which is high, and UP1 and UP2 signals, which are low during this period. This results in a negative correction, i.e., charge down, for one CLK cycle from T3 to T5.

During the next VCOCLK cycle from T5 to T7, the phase detector 300 performs a positive correction, i.e., charge up, to offset the positive correction performed during the previous VCOCLK cycle between T3 and T5. Specifically, at the rising edge of next VCOCLK pulse (i.e., T5), the flip-flop 304 samples and outputs the state of vdd at its "D" input port is DOWN, which is high. At the output of the flip-flop 308, UP2 signal also transitions from low to high because DOWN is high at T5. Similarly, UP1 signal also transitions from low to high since DATA is high at T5. The AND gate 306 receives the high UP1 and DOWN signals from the flip-flops 302 and 304 and generates a high state for RESET1 signal. The optional delay element 310 delays the RESET1 signal by a specified delay time and provides the delayed RESET1 signal to reset the flip-flop 302 and 304.

To cancel out the correction made in the previous CLK cycle from T3 to T5, the correction signal UP2 remains high for one VCOCLK cycle width between T5 and T7. The net sum of the correction signals UP1, UP2, and DOWN is positive as shown in CORRECTION waveform between T5 and T7. Accordingly, the negative correction of the previous CLK cycle is offset by the positive correction to produce an overall correction of zero. This process continues in a similar manner so that, over time, the overall CORRECTION waveform exhibits zero net change when integrated over time. In this manner, the correction signal from flip-flop 308 is used to cancel out the over correction of the previous clock cycle. By using the flip-flop 308, the dual mode phase and frequency detector 301 provides significant savings in cost, power, and die area over conventional solutions that typically use expensive data locked loops with additional analog circuits such as a charge pump, filter, divider, etc.

In the phase and frequency detector 301, the delay element 310 functions to provide a specified delay for resetting the flip-flops 302 and 304. For example, the delay element 310 may add a half cycle of delay to the reset signal from the AND gate 306 by employing any suitable number of delay logic elements such as inverters, flip-flops, etc. In one embodiment, delay logic elements may be inserted between flip-flops 302 and 304 and the charge pump 312 to ensure that minimum width of the UP1 and DOWN signals to allow the charge pump 312 to turn on and off without causing a glitch.

In the example above, the phase and frequency detector 301 may cause the data synchronizer loop to go the wrong direction for a clock cycle before the correction takes place. This may add jitter to the data synchronizer clock. To reduce such jitter, UP1 and DOWN signals may be delayed by a full clock cycle to allow the correction signal UP2 to occur at the same time as the phase and frequency detector starts to go the wrong way. In one embodiment, one or more delay elements (e.g. inverts, buffers, latches, etc.) may be inserted in the signal paths to provide the full clock cycle delay.

During the detection of data in phase detection mode, the data signal may slide forward in time with reference to CLK signal. For example, one or more data pulses may slide forward in time. Typically, the worst case is where a data pulse slides forward in time by a half clock cycle. As is well known in the art, this may cause and undesirable race condition in a timing loop, thereby preventing effective tracking of the data signal phase. The race condition causes the DOWN and UP signals to reset before UP2 can be clocked by the rising edge of VCOCLK.

Figure 5:
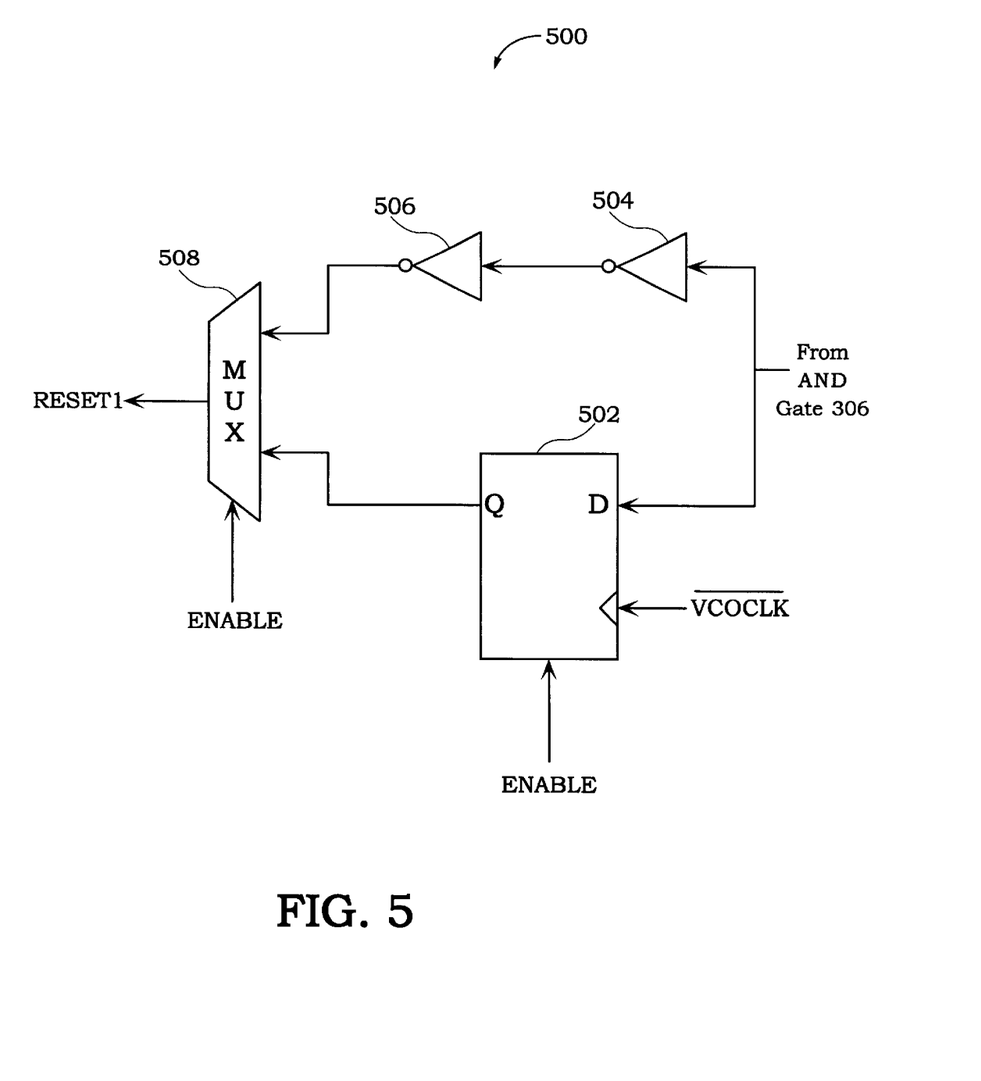
FIG. 5 illustrates a more detailed block diagram of a delay element in accordance with one embodiment of the present invention.

In one embodiment, the delay element 310 is configured to add a half cycle of delay to the reset signal from the AND gate 306 to prevent such race conditions. FIG. 5 illustrates a more detailed block diagram of the delay element 310 in accordance with one embodiment of the present invention. The delay element 310 includes a flip-flop 502, a pair of inverters 504 and 506, and a multiplexer (MUX) 508. In the phase and frequency detector mode, the reset signal from the AND gate 306 is provided to the inverters 504 and 506, which are arranged to provide a specified minimum pulse width. The delayed reset signal is then provided to the multiplexer 508 as input.

In the phase detector mode, on the other hand, the flip-flop 502 is enabled by ENABLE signal and receives the reset signal from the AND gate 306 and an inverse VCO clock VCOCLK. The flip-flop 502 delays the reset signal for half VCOCLK cycle and feeds the delayed reset signal to the multiplexer 508. The multiplexer 508 transmits one of the delayed reset signals as RESET1 signal in response to the ENABLE signal. On the other hand, if the ENABLE signal indicates a phase and frequency detection mode, the multiplexer 508 outputs the delayed reset signal from the inverter 506. It should be noted that the ENABLE signal provided to the flip-flop 502 and the multiplexer 508 is the same signal provided to the flip-flop 308 used in generating correction signal UP2 in FIG. 3. In doing so, the flip-flop 502 allows efficient delaying of DOWN and UP by half cycle and therefore allows proper corrections to be made.

Figure 6:
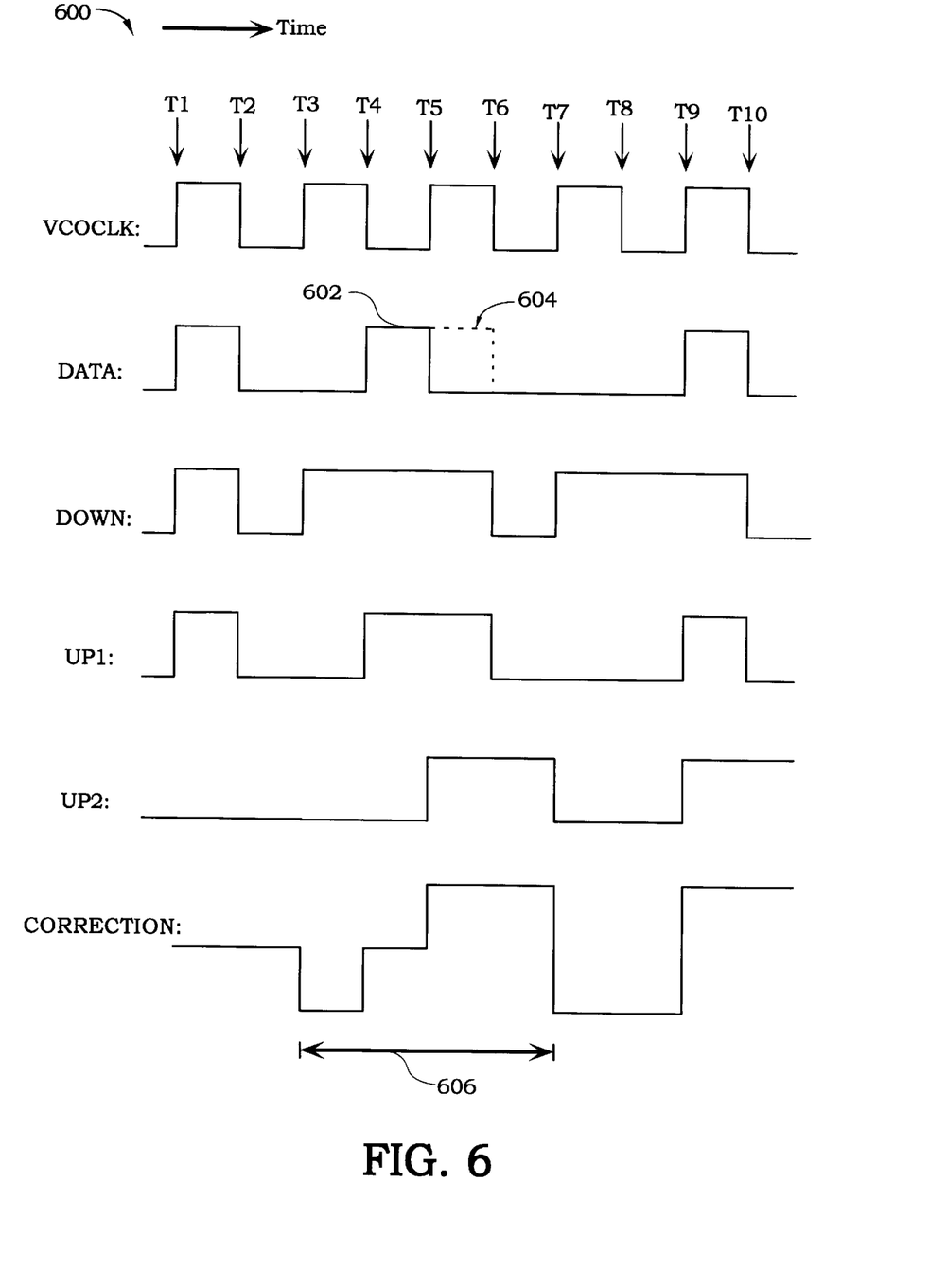
FIG. 6 shows a timing diagram of signal waveforms when a data pulse slides forward in time by a half clock cycle.

FIG. 6 shows a timing diagram 600 of signal waveform when a data pulse 602 slides forward in time by a half clock in accordance with one embodiment of the present invention. The VCOCLK, DOWN, and data waveforms in FIG. 6 are identical to those FIG. 4 except that the data pulse 604 has slid forward by a half clock cycle in time to data pulse 602. When the data pulse 604 slides forward in time from by a half VCOCLK cycle, the positive and negative corrections will not cancel out to produce a CORRECTION waveform that exhibits zero net charge when integrated over time.

Initially, the timing diagram 600 is same as timing diagram 400 until time T4, which is falling edge of VCOCLK. When data pulse 602 that has slid forward in time by half a clock cycle is received at time T4, the DOWN signal at the output of flip-flop 304 remains high, which is a false correction. At the same time, the output signal UP1 of flip-flop 302 transitions from low to high. In response to the high DOWN and UP1 signals, the AND gate 306 and the delay element 310 produce a RESET1 signal that is delayed by a half CLK cycle. This causes the flip-flops 302 and 304 to reset so that the DOWN and UP1 signals transition to low at T6. On the other hand, the correction signal UP2 at the output of flip-flop 308 transitions from low to high at T5 in response to the high DOWN signal and the rising edge of VCOCLK and remains high for one VCOCLK cycle from T5 and T7. As shown in FIG. 6, the net correction as indicated by CORRECTION signal 606 between T3 and T7 is positive for a half clock cycle. In response to this positive half clock, the charging pump 312 charges up the loop filter 316 to accelerate the VCO 314.

The present invention, a dual mode phase and frequency detector, is thus described. Although the foregoing invention has been described in some detail for purposes of clarity of understanding, it will be apparent that certain changes and modifications may be practiced with the scope of appended claims. Accordingly, the present embodiments are to be considered as illustrative and not restrictive, and the invention is not to be limited to the details given herein, but may be modified with the scope and equivalents of the appended claims.

What is claimed is:

1. A dual mode phase and frequency detector for use with a charge pump and a loop filter, the charge pump being adapted to adjust charging of the loop filter to adjust a VCO for generating a digital clock, the dual mode phase and frequency detector comprising:
   a phase and frequency detector arranged to receive the digital clock for tracking a reference clock signal, the phase and frequency detector being configured to generate control signals in response to the digital clock and the reference clock signal, the control signals being adapted to control charging or discharging of the loop filter by the charge pump when the phase and frequency detector is operating in a phase and frequency detector mode responsive to a mode control signal; and
   a delay element couple to receive the mode control signal and one of the control signals from the phase and frequency detector for generating an auxiliary control signal in response to the VCO digital clock, the first delay element generating the auxiliary control signal when the phase and frequency detector is operating in a phase detector mode responsive to the mode control signal, wherein the auxiliary control signal and the control signals are adapted to control the charge pump that charges or discharges the loop filter for adjusting the digital clock of the VCO when the phase and frequency detector is operating in the phase detector mode.

2. The dual mode phase and frequency detector as recited in claim 1, wherein the digital clock tracks phase and frequency of the reference clock signal when the phase and frequency detector is operating in the phase and frequency detector mode.

3. The dual mode phase and frequency detector as recited in claim 1, wherein the digital clock tracks only phase of the reference clock signal when the phase and frequency detector is operating in the phase detector mode.

4. The dual mode phase and frequency detector as recited in claim 1, wherein the delay elements is a flip-flop arranged to receive the digital clock and the one of the control signals as inputs and wherein the flip-flop generates the auxiliary control signal as an input to the charge pump.

5. The dual mode phase and frequency detector as recited in claim 4, wherein the one of the control signals and the auxiliary control signal are used to adjust the charge pump so that the loop filter is charged up.

6. The dual mode phase and frequency detector as recited in claim 5, wherein one or more of the other control signals are used to adjust the charge pump so that the loop filter is charged down.

7. The dual mode phase and frequency detector as recited in claim 1, wherein the dual mode phase and frequency detector is coupled to the VCO to receive the digital clock and wherein the VCO speeds up the digital clock when the loop filter is charged up and slow down the digital clock when the loop filter is charged down.

8. The dual mode phase and frequency detector as recited in claim 1, wherein the auxiliary control signal is used to adjust the charge pump to charge up the loop filter and wherein the control signals include:
   a first correction signal for adjusting the charge pump so that the loop filter is charged up; and
   a second correction signal for adjusting the charge pump so that the loop filter is charged down.

9. A dual mode phase and frequency detector for use with a charge pump and a loop filter, the charge pump being adapted to adjust charging of the loop filter to adjust a VCO for generating a VCO clock, the dual mode phase and frequency detector comprising:
   a phase and frequency detector arranged to receive the VCO clock for tracking a reference clock signal, the phase and frequency detector being configured to generate a first control signal and a second control signal in response to the VCO clock and the reference clock signal, the first and second control signals being adapted to control the charge pump for charging or discharging the loop filter when the phase and frequency detector is operating in a phase and frequency detector mode responsive to a mode control signal; and
   a delay element couple to receive the mode control signal and the second control signal from the phase and frequency detector for generating an auxiliary control signal in response to the VCO clock, the first delay element generating the auxiliary control signal when the phase and frequency detector is operating in a phase detector mode responsive to the mode control signal, wherein the auxiliary control signal and the first and second control signals are adapted to control the charge pump that adjusts the charging or discharging of the charge pump for controlling the VCO clock when the phase and frequency detector is operating in the phase detector mode such that the VCO clock tracks only phase of the reference clock signal.

10. The dual mode phase and frequency detector as recited in claim 9, wherein the phase and frequency detector includes:
    a first flip-flop arranged to receive the reference clock signal for outputting the first control signal;
    a second flip-flop arranged to receive the VCO clock for outputting the second control signal; and
    a logic gate for receiving the first and second control signals to generate a reset signal, wherein the first and second flip-flops are reset in response to the reset signal.

11. The dual mode phase and frequency detector as recited in claim 10, wherein the first control signal controls the charge pump to charge up the loop filter when activated and wherein the second control signal controls the charge pump to discharge the loop filter when activated.

12. The dual mode phase and frequency detector as recited in claim 11, wherein the auxiliary control signal controls the charge pump to charge up the loop filter when activated.

13. The dual mode phase and frequency detector as recited in claim 9, wherein the delay element is a third flip-flop.

14. The dual mode phase and frequency detector as recited in claim 10, wherein the phase and frequency detector further includes;

a delay circuit coupled between the logic gate and the first and second flip-flops for delaying the reset signal, wherein the delay circuit delays the reset signal until the falling edge of the VCO clock when the dual mode phase and frequency detector is operating in the phase detection mode, and wherein the delay circuit delays the reset signal by a specified VCO clock cycle when the dual mode phase and frequency detector is operating in the phase and frequency detection mode.

15. The dual mode phase and frequency detector as recited in claim 14, wherein the delay circuit includes:

a set of inverters coupled in series for delaying the reset signal by the specified VCO clock cycle;

a fourth flip-flop coupled in parallel to the set of inverters for delaying the reset signal until the falling edge of the VCO clock; and a multiplexer coupled to receive the delayed reset signals from the set of inverters and the fourth flip-flop, wherein the multiplexer selects the delayed reset signal from the set of inverters when the dual mode phase and frequency detector is operating in the phase and frequency detection mode and wherein the multiplexer selects the delayed reset signal from the fourth flip-flop when the dual mode phase and frequency detector is operating in the phase only detector mode.

16. The dual mode phase and frequency detector as recited in claim 9, wherein the dual mode phase and frequency detector is coupled to the VCO to receive the VCO clock and wherein the VCO speeds up the VCO clock when the charge pump charges up the loop filter and slows down the VCO clock when the charge pump charges down the loop filter.

17. A data synchronizer comprising:

a loop filter for generating a VCO control signal;

a charge pump for generating an output signal for adjusting charging or discharging of the loop filter;

a VCO coupled to receive the VCO control signal from the loop filter, wherein the VCO control signal is adapted to adjust the VCO for generating a VCO clock;

a phase and frequency detector coupled to receive the VCO clock for tracking a reference signal that has a phase and frequency, the phase and frequency detector generating control signals in response to the VCO clock and the reference signal, the control signals being adapted to control the charge pump for tracking the phase and frequency of the reference signal; and a delay element coupled to receive one of the control signals of the phase and frequency detector for generating another control signal in response to one of the first control signals for tracking only the phase of the reference signal, wherein the first control signals and the another control signal are adapted to control the charge pump for tracking only the phase of the reference signal, wherein the delay element is a first flip-flop arranged to receive the one of the control signals and the VCO clock as inputs and wherein the first flip-flop generates the another control signal as an input to the charge pump.

18. The data synchronizer as recited in claim 17, wherein the data synchronizer further comprising:

a divider coupled to receive the VCO clock from the VCO for dividing the VCO clock by a specified factor.

19. The data synchronizer as recited in claim 17, wherein the phase and frequency detector includes:

a second flip-flop arranged to receive the reference clock signal and for generating the first control signal of the control signals that is not provided to the first delay element;

a third flip-flop arranged to receive the VCO clock for generating a second control signal of the control signals that is provided to the delay element; and a logic gate for receiving the control signals to generate a reset signal, wherein the second and third flip-flops are reset in response to the reset signal.

20. The data synchronizer as recited in claim 19, wherein the first control signal that is not provided to the first delay element and the second control signal controls the charge pump to charges up the loop filter when activated and wherein the second control signal that is provided to the first delay element control the charge pump to charge down the loop filter when activated.

21. The data synchronizer as recited in claim 17, wherein the delay element is a D flip-flop.

22. The data synchronizer as recited in claim 19, wherein the phase and frequency detector further includes:

a delay circuit coupled between the logic gate and the second and third flip-flops for delaying the reset signal, wherein the delay circuit delays the reset signal until falling edge of the VCO clock when tracking only the phase of the reference signal, and wherein the delay circuit delays the reset signal by a specified VCO clock cycle when tracking both the phase and frequency of the reference signal.

23. The data synchronizer as recited in claim 22, wherein the delay circuit includes:

a set of inverters coupled in series for delaying the reset signal by the specified VCO clock cycle;

a fourth flip-flop coupled in parallel to the set of inverters for delaying the reset signal until the falling edge of the VCO clock; and a multiplexer coupled to receive the delayed reset signals from the set of inverters and the fourth flip-flop, wherein the multiplexer selects the delayed reset signal from the set of inverters when the dual mode phase for tracking both the phase and frequency of the reference signal, and wherein the multiplexer selects the delayed reset signal from the fourth flip-flop when tracking only the phase of the reference signal.

24. The data synchronizer as recited in claim 17, wherein the phase and frequency detector is coupled to the VCO to receive the VCO clock and wherein the VCO speeds up the VCO clock when the loop filter is charged up and slows down the VCO clock when the loop filter is charged down.

* * * * *